(12) United States Patent
Chen

(10) Patent No.: US 11,169,410 B2
(45) Date of Patent: Nov. 9, 2021

(54) DISPLAY PANEL AND DISPLAY DEVICE

(71) Applicants: HKC CORPORATION LIMITED, Guangdong (CN); CHONGQING HKC OPTOELECTRONICS TECHNOLOGY CO., LTD., Chongqing (CN)

(72) Inventor: Wei Chen, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 430 days.

(21) Appl. No.: 16/303,730

(22) PCT Filed: Jul. 3, 2017

(86) PCT No.: PCT/CN2017/091405
§ 371 (c)(1),
(2) Date: Nov. 21, 2018

(87) PCT Pub. No.: WO2018/176669
PCT Pub. Date: Oct. 4, 2018

(65) Prior Publication Data
US 2020/0285105 A1    Sep. 10, 2020

(30) Foreign Application Priority Data
Mar. 30, 2017    (CN) .......................... 201710202169.9

(51) Int. Cl.
*H01L 27/12*    (2006.01)
*G02F 1/1335*    (2006.01)
*G02F 1/1362*    (2006.01)
*H01L 27/32*    (2006.01)
*G02F 1/1333*    (2006.01)

(52) U.S. Cl.
CPC .. *G02F 1/133526* (2013.01); *G02F 1/133553* (2013.01); *G02F 1/136286* (2013.01); *H01L 27/124* (2013.01); *G02F 1/133388* (2021.01); *G02F 1/133562* (2021.01); *H01L 27/3276* (2013.01)

(58) Field of Classification Search
CPC ......... G02F 1/133526; G02F 1/133553; G02F 1/136286; G02F 1/133388; G02F 1/133562; G02F 1/133331; G02F 1/13356; H01L 27/124; H01L 27/3276; H01L 51/5275; H01L 27/3288; H01L 51/5271; H01L 27/3211
See application file for complete search history.

(56) References Cited

U.S. PATENT DOCUMENTS 8,878,262 B2 * 11/2014 Sakakura ............ H01L 27/3223
257/291

* cited by examiner

*Primary Examiner* — Kyoung Lee
(74) *Attorney, Agent, or Firm* — Wang Law Firm, Inc.

(57) ABSTRACT

A display panel and a display device are provided. The display panel includes a substrate. The substrate includes a display area in the middle of the substrate and a wiring area around the display area. A refractive device is disposed on the front side of the substrate to refract light from the display area and the wiring area and so partially or totally prevent the wiring area from being seen.

14 Claims, 7 Drawing Sheets

DISPLAY PANEL AND DISPLAY DEVICE

CROSS REFERENCE TO RELATED APPLICATIONS

The present application is a national stage application of PCT Patent Application PCT/CN2017/091405, filed Jul. 3, 2017, which claims the benefit of Chinese application Serial No. 201710202169.9, filed Mar. 30, 2017, the subject matter of each of which is incorporated herein by reference.

FIELD OF THE INVENTION

The present application relates to display technology, and more specifically, a display panel and a display device.

BACKGROUND OF THE INVENTION

Because of continuous improvement of technology, thinner physical body, higher energy efficiency, and lower radiation emission make liquid-crystal display (LCD) a mainstream product being broadly used in various kinds of applications. Most of liquid-crystal displays are backlit type, which includes a liquid-crystal panel and a backlight module. LCD typically includes liquid crystal molecules between two parallel glass substrates. When a driving voltage is applied on the substrates, the liquid crystal molecules are oriented allowing for the control of light to form images.

Among LCDs, the Thin Film Transistor-Liquid Crystal Display or TFT-LCD is becoming prominent in display industry because of its low-power consumption, high image quality, and good production yield. Similarly, a TFT-LCD also includes a liquid-crystal panel and a backlight module, wherein the liquid-crystal panel contains a color filter substrate or a CF substrate, a thin film transistor substrate or a TFTSubstrate, and a mask. There are also a transparent electrode and a layer of liquid crystal molecules (LC molecules) located between these substrates.

In order to improve a viewing sensation of reality for TFT-LCD, narrow border or borderless design has become a focus in liquid-crystal display technology. Apart from the border design, cost reduction is also a bonus pursued by one skilled in the art.

To meet these requirements, thin-film technology used for semiconducting devices such as in-plane liquid crystal driving switches is also applied to pattern the gate driver circuits and the array substrate in-plane structures at the same time. This helps reduce the cost for a scan driver and avoid soldering of the flexible printed circuit to the rim of liquid crystal display panel. Gate driver circuit not only boosts the control and design of a liquid-crystal display, it also narrows down the border width requirement of the liquid-crystal display.

However, gate driving circuits are still space consuming. In addition to the sealing required on both sides of the liquid-crystal layer, true borderlessness is still out of reach. Since black borders on both sides of the display panel have negative effect on users' viewing experience, black border width reduction and elimination is an urgent problem.

It should be noted that the above description of the background art is merely provided for clear and complete explanation of certain embodiments herein and for easy understanding by those skilled in the art. And it should not be understood that the above technical solution is known to those skilled in the art as it is described in the background art.

SUMMARY OF THE INVENTION

To solve the aforementioned problems, the purpose of the present application is to provide a solution to reduce the black border in a display panel and display device.

For that purpose, the present application provides a display panel, comprising: a substrate; the substrate includes a display area in the middle of the substrate and a wiring area around the display area; a refractive device is disposed on a front side of the substrate to refract light from the display area and the wiring area, so to partially or totally prevent the wiring area from being seen.

In the present application, the refractive device is disposed in front of the substrate (the substrate practically includes structures of an array substrate, a color filter substrate, and a liquid-crystal layer, and because these structures are not the focuses of the present application, the related contents will not be further described), such that the passing light will be refracted. The light in the display area will mostly follow the normal direction through the refractive. A small portion of light from the display area and most or all of the light from the wiring area will be refracted by the refractive device. As a result, the light from the wiring area will not reach a viewer in front of the display panel, and the small portion of light from the display area will be directed to replace the light from the wiring area and received by the viewer. Therefore, the wiring area is mostly or totally unperceivable by the viewer. Accompanying with narrow border technology, the present application can minimize the black border (caused by the wiring area) and improve the viewing experience.

Accompanying with figures, specific embodiments of the present application will be described hereinafter. These embodiments illustrate some applicable ways of the present application. The present application is however not limited by these embodiments. Rather, the invention is to cover all modifications, equivalents, and alternatives falling within the spirit and scope of the appended claims.

The technical description or/and features in one embodiment can be also identically or comparably used in other embodiments. For example, they can be used in combination with the features in other embodiments or to replace features in other embodiments.

It should be noted that the term "include/including" or "comprise/comprising" means the named elements are essential but is inclusive or open-ended and does not exclude additional, unrecited elements or method steps.

BRIEF DESCRIPTION OF THE DRAWINGS

The accompanying drawings, which are incorporated in and constitute a part of this specification, illustrate several embodiments of the invention and together with the description, serve to explain the principles of the invention. It is obvious that the drawings in the following description are only related to some embodiments of the present application. Those ordinarily skilled in the art may obtain other embodiments according to these drawings, without any inventive work.

DESCRIPTION OF THE PREFERRED EMBODIMENTS

To enable those skilled in the art to better understand the technical solutions of the present application, the example embodiments of the present application are described below with reference to the accompanying drawings. Apparently, the described example embodiments merely represent a part of and not all of the embodiments of the present application. Based on the embodiments of the present application, all the other embodiments derived by persons of ordinary skill in the art, without using creative efforts, shall fall within the protection scope of the present application.

Figure 1:
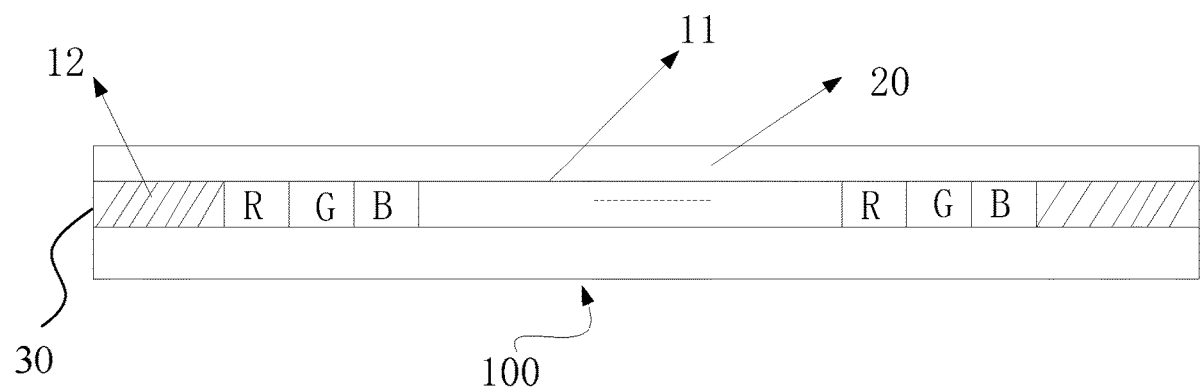
FIG. 1 is a schematic diagram showing a display panel of the present application.

The following refers to FIG. 1, which is a schematic diagram showing a display panel of the present application. The display panel 100 includes:

a substrate 10;

the substrate 10 includes a display area 11 in the middle of the substrate 10 and a wiring area 12 around the display area 11;

A refractive device 20 is disposed on a front site of the substrate 10. The refractive device 20 refracts the light from the display area 11 and the wiring area 12 in such a way that the wiring area 12 is partially or totally not seeable.

In the present application, the refractive device is disposed in front of the substrate (the substrate practically includes structures of an array substrate, a color filter substrate, and a liquid-crystal layer, and because these structures are not the focuses of the present application, the related contents will not be further described), such that the passing light will be refracted. The light from the display area will mostly follow the normal direction through the refractive. A small portion of light from the display area and most or all of the light from the wiring area will be refracted by the refractive device. As a result, the light from the wiring area is hard or impossible to reach a viewer in front of the display panel, and the small portion of light from the display area will be directed to replace the light from the wiring area and received by the viewer. Therefore, the wiring area is mostly or totally unperceivable by the viewer. Accompanying with narrow border technology, the present application can minimize the black border (caused by the wiring area) and improve the viewing experience.

Figure 2:
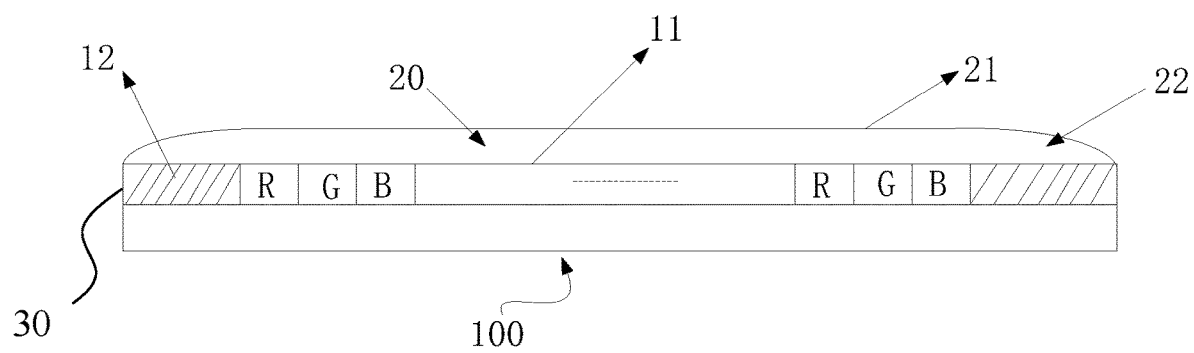
FIG. 2 is a schematic diagram showing a display panel with a convex lens in an embodiment of the present application.

In an optional embodiment of the present application, the following refers to FIG. 2, which is a schematic diagram showing a display panel with a convex lens. Accompanying with FIG. 1, the refractive device 20 includes a middle flat portion (no reference number) and a refractive portion (no reference number) on each of the two sides of the flat portion. In this embodiment, the middle flat portion allows that the light from the pixels in the display area can be seen normally. The refractive portion refracts a portion of light from the display area and most or all of the light from the wiring area. As a result, the light from the wiring area can not reach the viewer and an image from the display area is extended to replace the image of the wiring area. In the viewer's perspective, the black border is diminished or disappeared and the viewing experience is improved. Therefore, a narrower border or borderlessness is achieved.

Figure 3:
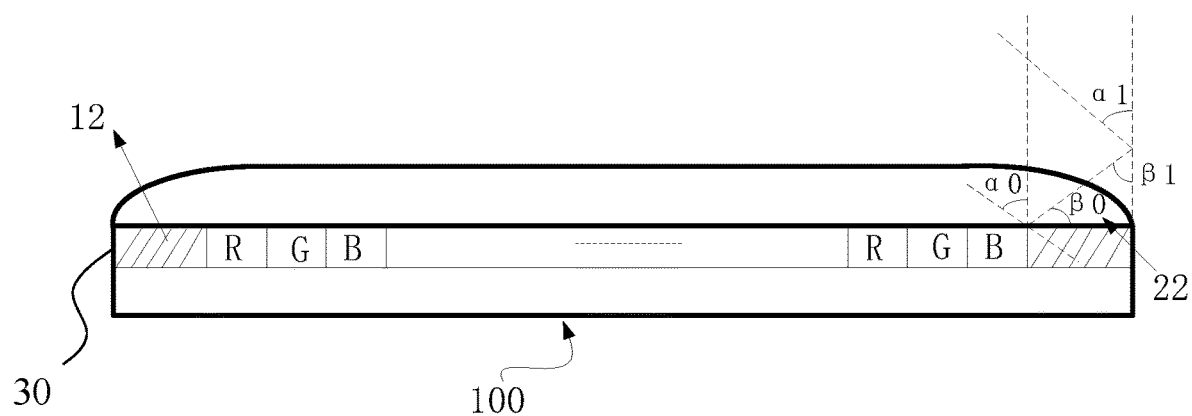
FIG. 3 is a schematic diagram showing a display concept of a near pixel in an embodiment of the present application.
Figure 4:
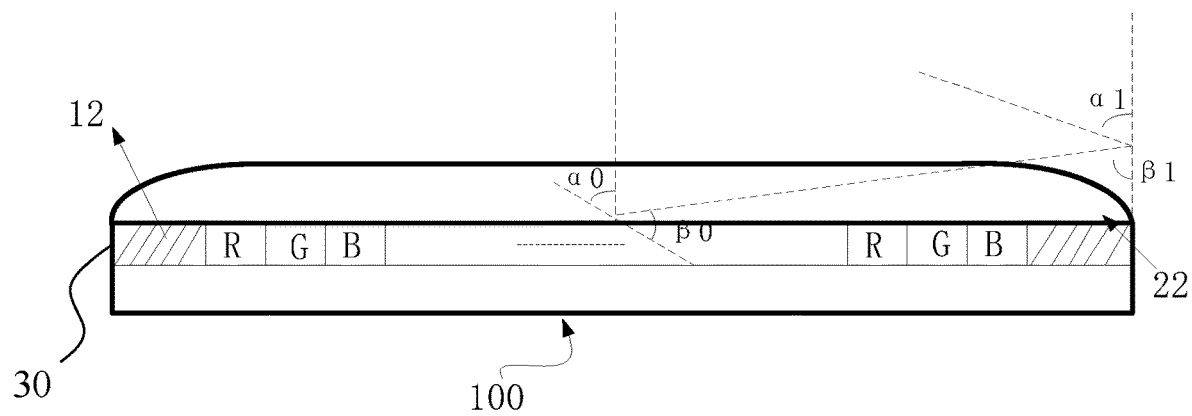
FIG. 4 is a schematic diagram showing a display concept of a middle pixel in an embodiment of the present application.
Figure 5:
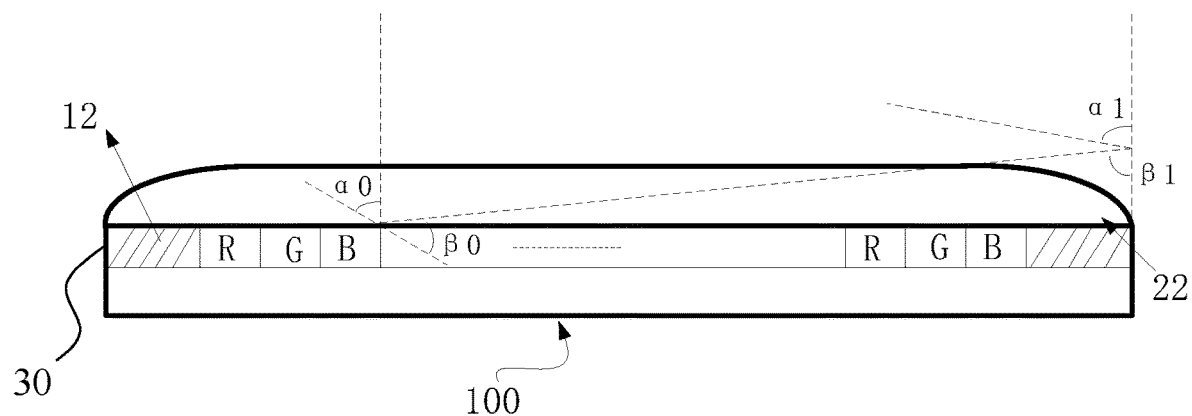
FIG. 5 is a schematic diagram showing a display concept of a far pixel in an embodiment of the present application.

FIG. 3 is a schematic diagram showing a display concept of a near pixel in an embodiment of the present application. FIG. 4 is a schematic diagram showing a display concept of a middle pixel in an embodiment of the present application. FIG. 5 is a schematic diagram showing a display concept of a far pixel in an embodiment of the present application. These figures illustrate how the light from the pixels in the display area is extended and is seen seemingly just emitted from the wiring area.

In the figures, angle $\alpha 0$ is equal to $\alpha 1$ and $\beta 0$ is equal to $\beta 1$.

In an optional embodiment, the flat portion is a plano lens 21 and the refractive portion is a convex lens 22 having its curve designed for the wiring area 12. In this embodiment, the refractive device includes one plano lens in the middle and one convex lens on each of the two sides of the plano lens. The plano lens allows that the light from the pixels in the display area can be seen normally, while a portion of light from the display area and most or all of the light from the wiring area are refracted by the convex lenses, such that the light from the wiring area can not reach a viewer and the image from the display area is extended to replace the image of the wiring area. In the viewer's perspective, the black border is diminished or disappeared and the viewing experience is improved. Therefore, a narrow border or borderlessness is achieved. In the present embodiment, the convex lenses and the plano lens can be integrally formed, which means edges of an original plano lens are cut to form the portion of the convex lenses based on the sizes and structures of the wiring area. Alternatively, the plano lens and the convex lenses are separate parts and assembled to form the refractive device. In this case, one can flexibly choose the widths or shapes of the convex lenses based on the type of the display panel and the size and structure of the wiring area, such that the wiring area or the black border is mostly or totally unperceivable by the viewer.

Figure 6:
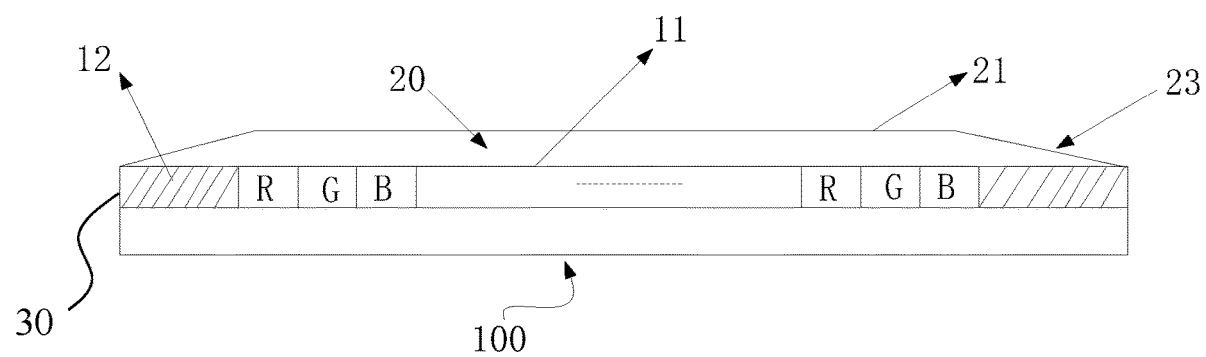
FIG. 6 is a schematic diagram showing a display panel with a sloped lens in an embodiment of the present application.

Another optional embodiment refers to FIG. 6, which is a schematic diagram showing a display panel with a sloped lens in an embodiment of the present application. Accompanying with FIGS. 1-5, the flat portion is a plano lens 21 and the refractive portion is an inclined lens 23 having its sloped angle designed for the wiring area and formed by a cutting process. In this embodiment, the refractive device includes one plano lens in the middle and one inclined lens on each of the two sides of the plano lens. The plano lens allows that the light from the pixels in the display area can be seen normally, while a portion of light from the display area and most or all of the light from the wiring area are refracted by the convex lenses, such that the light from the wiring area can not reach a viewer and the image from the display area is extended to replace the image of the wiring area. In the viewer's perspective, the black border is diminished or disappeared and the viewing experience is improved. Therefore, a narrower border or borderlessness is achieved. In the present embodiment, the inclined lenses and the plano lens can be integrally formed, which means edges of an original plano lens are cut to form the portion of the inclined lens based on the sizes and structures of the wiring area. Alternatively, the plano lens and the inclined lenses are separate parts and assembled to form the refractive device. In this case, one can flexibly choose the widths or shapes of the inclined lenses based on the type of the display panel and the size and structure of the wiring area, such that the wiring area or the black border is mostly or totally unperceivable by the viewer.

In this embodiment, the background for display area extension and imperceptible wiring area is similar to that illustrated in FIGS. 3-5 and is therefore not further described hereinafter.

In an optional embodiment, a reflector 30 is disposed on the outside wall surface of the wiring area 12 and is dimensioned to be equal to the area of the outside wall surface. In this embodiment, the reflector 30 is dimensioned to be similar to or equal to the area of the outside wall surface. The reflector 30 reflects the light from the wiring area such that wiring area is unperceivable by a side viewer or a viewer at large angle with respect to the normal of the display panel. Therefore, a narrow border or borderlessness is achieved and the viewing experience is improved.

In an optional embodiment, the refractive device 20 and the reflector 30 are made of tempered glass. In this embodiment, the refractive device and reflector made of tempered glass can prevent a scratch on the screen or the reflector and offer good protection to the underlying components by improving the ability to withstand impacts. The reflector also provides supporting effect to the structure of the display panel and device.

In an optional embodiment, the wiring area 12 includes a gate driver chip and a gate driving circuit. In this embodiment, although the border of the display panel adopting the gate driver and the gate driving circuit is considerably wide, the refractive device can perceivably reduce the black border or make the black border disappeared.

In an optional embodiment, the wiring area 12 includes a gate driver circuit. In this embodiment, although the border of the display panel adopting the gate driver circuit is rather narrow, the refractive device of the present application can further reduce the black border or make the black border disappeared. Optionally, the gate driver circuit is using GOA (Gate Driver on Array) technology, that is the gate driver circuit is formed on the array substrate.

In an optional embodiment, the refractive device 20 extends an image formed by the pixels in the display area 11 to the wiring area 12 and the wiring area 12 is therefore unperceivable by the viewer. In this embodiment, the main effect of the refractive device is to extend the image formed by the pixels in the display area to the wiring area, such that the extended portion of the image is perceived by a viewer as coming from the wiring area. The light from the wiring area is also refracted and can not reach the viewer. In the viewer's perspective, the black border is disappeared from being viewed and the viewing experience is therefore improved.

Figure 7:
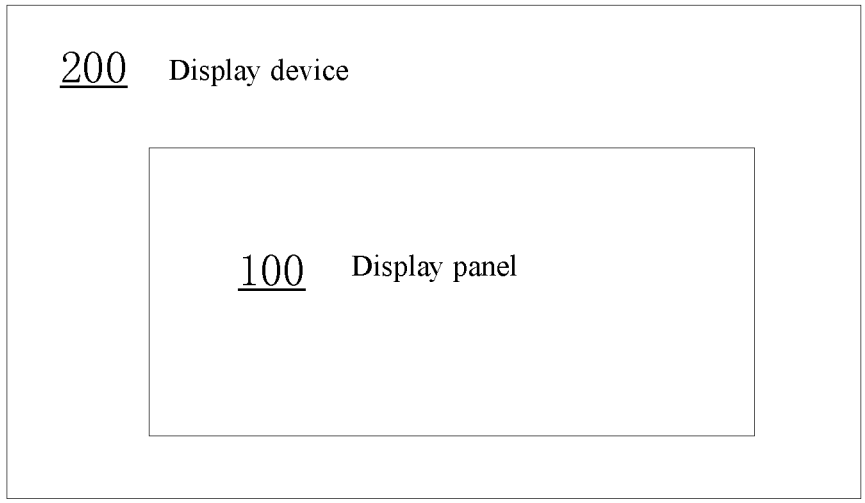
FIG. 7 is a schematic diagram showing a display device of the present application.

The following refers to FIG. 7, which is a schematic diagram showing a display device of the present application. The display device 200 include any one of aforementioned display panels 100. The display panel 100 can be a liquid-crystal display panel, an OLED display panel, a curved display panel, or any other type of display panel.

In the display device of the present application, the main component is a display panel. The refractive device is disposed in front of the substrate of the display panel (the substrate practically includes structures of an array substrate, a color filter substrate, and a liquid-crystal layer, and because these structures are not the focuses of the present application, the related contents will not be further described), such that the passing light will be refracted. The light in the display area will mostly follow the normal direction through the refractive. A small portion of light from the display area and most or all of the light from the wiring area will be refracted by the refractive device. As a result, the light from the wiring area is hard or impossible to reach a viewer in front of the display panel, and the small portion of light from the display area will be directed to replace the light from the wiring area and received by the viewer. Therefore, the wiring area is mostly or totally unperceivable by the viewer. Accompanying with narrow border technology, the black border reduction technique of the present application can minimize the black border (caused by the wiring area) and improve viewing experience.

The description above provides preferable embodiments of the present application. It should be noted that modifications and variations can be made without any creative effort by one skilled in the art based on the present application. Any technical feature that can be obtained by logical analysis, inference, or limited experimentation on the basis of the present application by one skilled in the art should be within the scope of the appended claims.

What is claimed is:

1. A display panel, comprising:
   a substrate comprising a display area in the middle of the substrate and a wiring area around the display area;
   a refractive device disposed on a front side of the substrate to refract a light from the display area and the wiring area, so as to partially or totally prevent the wiring area from being seen;
   wherein the refractive device comprises a flat portion and a refractive portion on each of two sides of the flat portion;
   wherein the flat portion is a plano lens and the refractive portion is an inclined lens having a sloped angle designed for the wiring area and formed by a cutting process.

2. A display panel, comprising:
   a substrate comprising a display area in the middle of the substrate and a wiring area around the display area;
   a refractive device disposed on a front side of the substrate to refract a light from the display area and the wiring area, so as to partially or totally prevent the wiring area from being seen;
   wherein the refractive device comprises a flat portion and a refractive portion on each of two sides of the flat portion;
   wherein the flat portion is a plano lens and the refractive portion is a convex lens having a curve designed for the wiring area.

3. The display panel of claim 2, wherein a reflector is disposed on an outside wall surface of the wiring area, and the reflector is dimensioned to be equal to an area of the outside wall surface, wherein the outside wall surface is a surface exposed to the outside.

4. The display panel of claim 3, wherein the refractive device and the reflector are made of a tempered glass.

5. The display panel of claim 2, wherein the wiring area comprises a gate driver chip and a gate driving circuit.

6. The display panel of claim 2, wherein the wiring area comprises a gate driver circuit.

7. The display panel of claim 2, wherein the refractive device extends an image formed by a plurality of pixels in the display area to the wiring area and the wiring area is partially or totally unperceivable by a viewer.

8. A display device, comprising:
   a display panel, comprising:
   a substrate comprising a display area in the middle of the substrate and a wiring area around the display area;

a refractive device disposed on a front side of the substrate to refract a light from the display area and the wiring area and so as to partially or totally prevent the wiring area from being seen;

wherein the refractive device comprises a flat portion and a refractive portion on each of two sides of the flat portion;

wherein the flat portion is a plano lens and the refractive portion is a convex lens having a curve designed for the wiring area.

9. The display device of claim 8, wherein a reflector is disposed on an outside wall surface of the wiring area, and the reflector is dimensioned to be equal to an area of the outside wall surface, wherein the outside wall surface is a surface exposed to the outside.

10. The display device of claim 9, wherein the refractive device and the reflector are made of a tempered glass.

11. The display device of claim 8, wherein the wiring area comprises a gate driver chip and a gate driving circuit.

12. The display device of claim 8, wherein the wiring area comprises a gate driver circuit.

13. The display device of claim 8, wherein the refractive device extends an image formed by a plurality of pixels in the display area to the wiring area and the wiring area is partially or totally unperceivable by a viewer.

14. The display device of claim 8, further comprising:

a reflector disposed on an outside wall surface of the wiring area, the outside wall surface being a surface exposed to the outside;

wherein the refractive device and the reflector are made of a tempered glass;

wherein the wiring area comprises a gate driver chip and a gate driving circuit;

wherein the refractive device extends an image formed by a plurality of pixels in the display area to the wiring area and the wiring area is partially or totally unperceivable by a viewer.

* * * * *